United States Patent [19]

Akahori et al.

[11] Patent Number: 4,960,071

[45] Date of Patent: Oct. 2, 1990

[54] THIN FILM FORMING APPARATUS

[75] Inventors: Takashi Akahori; Satoshi Nakayama, Amagasaki, both of Japan

[73] Assignee: Sumitomo Metal Industries Ltd., Osaka, Japan

[21] Appl. No.: 250,745

[22] Filed: Sep. 29, 1988

[30] Foreign Application Priority Data

Sep. 30, 1987 [JP] Japan .................. 62-248911

[51] Int. Cl.$^5$ .................. C23C 16/48; C23C 16/50
[52] U.S. Cl. .................. 118/722; 118/723
[58] Field of Search .................. 118/722, 723, 715

[56] References Cited

U.S. PATENT DOCUMENTS

| | | | |
|---|---|---|---|
| 3,893,234 | 7/1975 | Levin | 427/163 |
| 4,576,698 | 3/1986 | Gallagher | 118/715 |
| 4,732,793 | 3/1988 | Itoh | 118/723 |
| 4,785,763 | 11/1988 | Saitoh | 118/715 |

FOREIGN PATENT DOCUMENTS

| | | | |
|---|---|---|---|
| 60-245217 | 5/1985 | Japan . | |
| 60-170037 | 7/1986 | Japan . | |
| 61-196528 | 8/1986 | Japan | 427/54.1 |

OTHER PUBLICATIONS

"Oyo Buturi", vol. 55, No. 6, pp. 606–611.
"Solid-State Physics", vol. 20, No. 8, pp. 564–566.

Primary Examiner—Richard Bueker
Attorney, Agent, or Firm—Burns, Doane, Swecker & Mathis

[57] ABSTRACT

The present invention relates to an apparatus to form a thin film on a specimen in a chamber by introducing electromagnetic waves into the chamber through a dielectric provided on a window of the chamber and activating the material gas in the chamber, and the forming apparatus according to the present invention has such a construction that an electrode connected to a high-frequency generating source is mounted near the dielectric. Consequently, when a high frequency is applied to the electrode, self-biases are generated on the inner surface of the dielectric (the surface on the side of the specimen), the plus ions in the chamber being attracted to the inner surface to strike thereon, and the sputtering being caused on the inner surface by the incidence energy. As a result, due to the sputtering effect, the generation of a pile of films on the inner surface of the dielectric can be prevented, while in the case where films are already piled on the inner surface of the dielectric these films can be removed.

11 Claims, 7 Drawing Sheets

THIN FILM FORMING APPARATUS

BACKGROUND OF THE INVENTION

1. Field of the Invention

The present invention relates to a thin film forming apparatus, and more in particularly to a thin film forming apparatus in which a thin film is formed on a specimen put in a chamber having a window first by introducing electromagnetic waves such as rays of light, microwaves or the like into the chamber through a dielectric provided on the passing line of the electromagnetic waves, then activating the material gas in the chamber with the use of these electromagnetic waves.

2. Description of the Prior Art

As for apparatuses to form a thin film on a specimen, several ones can be enumerated, such as, for example, a photo CVD (Chemical Vapor Deposition) apparatus in which a thin film is formed on a specimen by introducing the rays of light into a chamber through a dielectric such as quartz glass or the like and activating the material gas in the chamber with the use of the rays of light, a microwave plasma CVD apparatus and an ECR (Electron Cyclotron Resonance) plasma CVD apparatus in which a thin film is formed on a specimen by introducing microwaves into a chamber through a dielectric and activating the material gas in the chamber with the use of microwaves, and a sputter apparatus wherein plasma caused by electromagnetic waves is utilized as the sputter source, for example, an ECR sputtering apparatus. In an ECR plasma CVD apparatus, the chamber is normally divided into a plasma-generating cell in order to generate plasma with the use of microwaves and a specimen-cell in order to form a thin film on the surface of the specimen with the use of plasma.

In a case where the rays of light or microwaves are introduced into the chamber through the dielectric in order to form a thin film on the specimen, a pile of films is generated on the inner surface of the dielectric to lower the transmissivity of the rays of light or the microwaves with respect to the dielectric. If such a state advances, there arises a trouble that the formation of the thin film on the surface of the specimen in the chamber cannot be performed sufficiently.

Therefore, in order to avoid such a state, the following preventive measures have conventionally been taken. For example, as shown in FIG. 1, a purge gas is blown against the inner surface of the dielectric 2 mounted on the chamber wall 1 in order to close the window 1a of the chamber C, from the gas introducing pipe 10 whose blowing outlet 10a is disposed near the window 1a in the chamber C, to check the generation of the pile of films. (See "Oyo Buturi" Vol. 55, No. 6 pp. 606-611.) Another measure is shown in FIG. 2 wherein a low vapor pressure substance 11 such as FOMBLIN OIL is applied on the inner surface of the dielectric 2 mounted on the chamber wall 1 in order to close the window 1a of the chamber C, to prevent the generation of the pile of films. (See "Solid-State Physics", Vol. 20, No. 8, pp. 564-566.) In both figures, the white arrow shows the introducing direction of the rays of light or microwaves.

However, it is not possible to prevent positively the generation of the pile of films only by blowing a purge gas against the inner surface of the dielectric, as shown in FIG. 1. In the case where a low vapor pressure substance 11 is applied on the inner surface of the dielectric 2, as shown in FIG. 2, there arises a problem that organic substances resulting from the substance 11 will mix in the thin film formed on the specimen.

When a film with a low photo-transmissivity with respect to the dielectric, such as amorphous silicon film, metallic films or the like is formed in the photo CVD, the transmissivity of the rays of light remarkably lowers, until the film-forming operations on the specimen come to stop as a result of the rays of light being reflected and absorbed by the film formed on the dielectric, even if the film-forming speed on the dielectric is reduced, according to the ways mentioned above. Also in the microwave plasma CVD as well as in the ECR plasma CVD, when a film with a low microwave-transmissivity with respect to the dielectric, such as a metallic film, Al, W, Mo or the like is formed, the microwave-transmissivity remarkably lowers, until the film-forming operations on the specimen come to stop as a result of the microwaves being reflected and absorbed by the film formed on the dielectric. Consequently in the conventional apparatuses as mentioned above it has been impossible to perform stable forming operations of a thin film.

SUMMARY OF THE INVENTION

The present invention has been made in order to solve aforementioned problems. The thin film forming apparatus according to the present invention is provided with an electrode connected to a high-frequency generating source, near a dielectric, and has a construction wherein the sputtering is generated on the inner surface of the dielectric.

Consequently, the first object of the present invention is to provide a thin film forming apparatus capable of preventing positively the generation of a pile of films on the inner surface of the dielectric by this sputtering.

The second object of the present invention is to provide a thin film forming apparatus capable of removing films already piled on the inner surface of the dielectric.

The third object of the present invention is to provide a thin film forming apparatus capable of preventing impure organic substances from mixing in the thin film to be formed.

The fourth object of the present invention is to provide a thin film forming apparatus capable of forming a thin film of a desired thickness without stopping the film-formation during operations.

The fifth object of the present invention is to provide a thin film forming apparatus capable of performing repeatedly the process of forming a thin film on the specimen without providing electrodes and the process of removing the film piled on the surface of the dielectric, by providing an electrode capable of being mounted to and being demounted from the dielectric.

The above and further objects and features of the invention will more fully be apparent from the following detailed description with accompanying drawings.

DESCRIPTION OF THE PREFERRED EMBODIMENTS

The present invention will be described with reference to the drawings showing the embodiments thereof.

Figure 1:
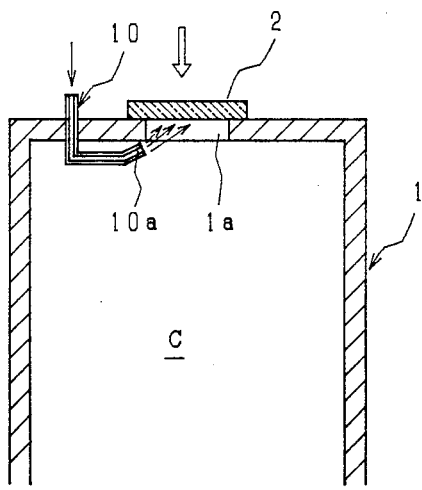
FIGS. 1 and 2 are vertical sections showing the principal part of conventional apparatus.
Figure 2:
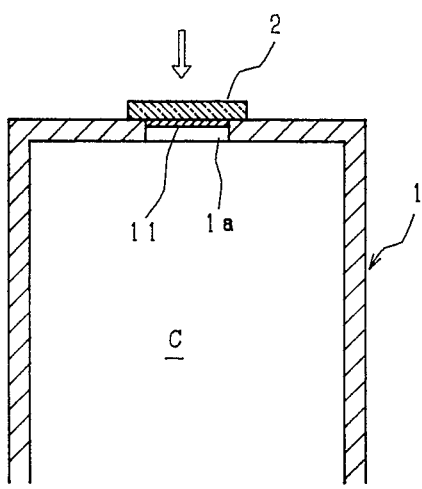
Figure 3:
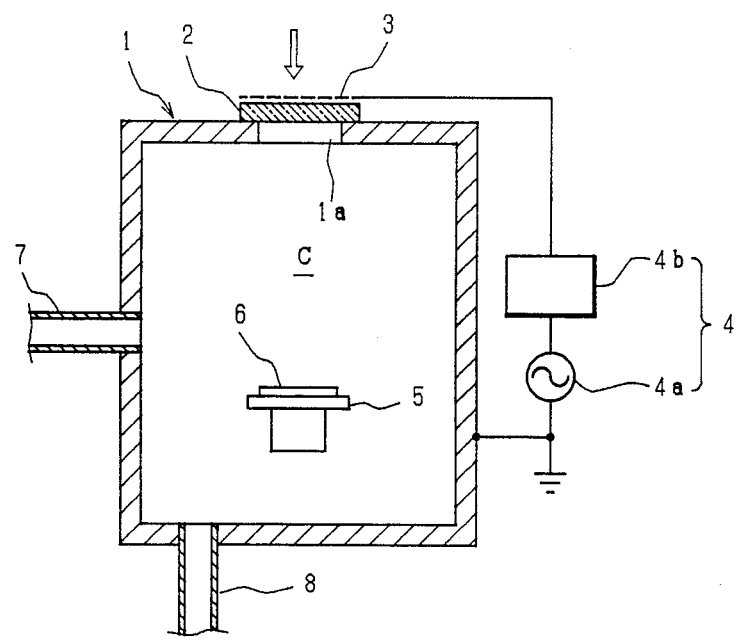
FIG. 3 is a vertical section showing the apparatus according to the present invention.

FIG. 3 is a vertical section showing an embodiment of the present invention, applied to a photo CVD apparatus. In the drawing, the signal C is a chamber with an opening portion which forms a window $1a$, and a chamber wall 1 constitutes its outer block. In the chamber C, a specimen stand 5 is provided and a specimen 6 is set on the specimen stand 5. The chamber C is provided with two more openings served as a gas pipe 7 in order to supply the material gas into the chamber C and an exhaust pipe 8 in order to exhaust the gas.

A dielectric 2 of a photo-transmissive substance such as quartz glass or the like is mounted, in such a way that the dielectric might cover the window $1a$, at the part where the window $1a$ of the chamber wall 1 is formed, and the rays of light as electromagnetic waves which activate the material gas to generate plasma are introduced into the chamber through the dielectric 2, as shown by the white arrow in the drawing.

An electrode 3 in the form of meshes is disposed on the outside of the dielectric 2 and adjacent thereto. The meshed electrode 3 is connected to one end of a high-frequency generating source 4 provided with a high-frequency oscillator $4a$ and a matching box $4b$. In this connection, the other end of the high-frequency generating source 4 is touched the ground, and at the same time it is connected to the chamber wall 1.

When a high frequency is applied to the meshed electrode 3 disposed on the outside of the dielectric 2 by the use of the high-frequency generating source 4, in such an apparatus according to the present invention, minus self-biases are generated on the inner surface of the dielectric 2 (the surface to which the plasma contacts) owing to the difference of the mobility of electrons and ions in plasma. The plus ions in the chamber C are attracted to the inner surface and to strike on it, due to the self-biases. This incidence energy causes the sputtering on the inner surface. The self-bias voltage can be controlled by controlling the high frequency applied to the meshed electrode 3 with the use of the high-frequency generating source 4.

When the sputtering (the sputter etching) is caused on the inner surface of the dielectric 2, the generation of a pile of films on the inner surface can be positively prevented because of the sputtering effects, while in the case where a pile of films is already caused these films can be removed.

Figure 4:
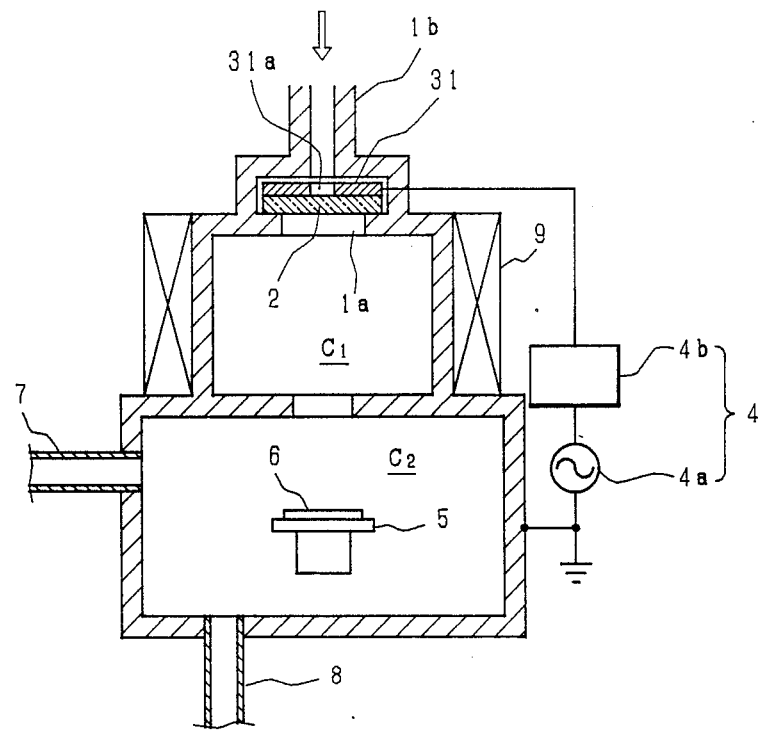
FIG. 4 is a vertical section showing another embodiment of the apparatus according to the present invention.

FIG. 4 is a vertical section showing an embodiment of the apparatus according to the present invention, applied to an ECR plasma CVD apparatus. In the present apparatus, the chamber is divided into a plasma-generating cell $C_1$ where plasma is generated with the use of microwaves and a specimen-cell $C_2$ where a thin film is formed on the surface of the specimen with the use of plasma. A microwave directing pipe $1b$ is provided at the position where the window $1a$ of the chamber wall 1 is formed and the dielectric 2 of a microwave-transmissive substance such as quartz glass or the like, in order to direct the microwaves as electromagnetic waves as shown by the arrow in the drawing. The plasma-generating cell $C_1$ is surrounded by coils 9, while the specimen-cell $C_2$ is provided with a specimen stand 5 on which a specimen 6 is set and the gas pipe 7 and the exhaust pipe 8 of the same construction as those in the aforementioned embodiment (FIG. 3).

A flat electrode 31 is inserted between the microwave directing pipe $1b$ and the dielectric 2, and the flat electrode 31 is provided with a piercing bore $31a$ of an inner diameter which corresponds to that of the microwave directing pipe $1b$. The flat electrode 31 is connected to the other end of the high-frequency generating source 4 in the same way as in the aforementioned embodiment (FIG. 3).

In this embodiment, the flat electrode provided with the piercing bore $31a$ in order to pass the microwaves is used instead of the meshed electrode 3 which is unable to transmit the microwaves, as shown in FIG. 3. The microwaves to be directed by the microwave directing pipe $1b$ are introduced into the plasma-generating cell $C_1$ through the piercing bore $31a$ of the flat electrode 31 and after passing through the dielectric 2, to generate plasma, and thus generated plasma is introduced into the specimen-cell $C_2$ to form a thin film on the surface of the specimen 6.

In this embodiment, the microwave introducing portion is constructed as mentioned above, so it is possible to prevent the generation of the pile of films on the inner surface of the dielectric 2 and remove the already piled films on this inner surface without obstructing the introduction of the microwaves into the chamber.

Figure 5:
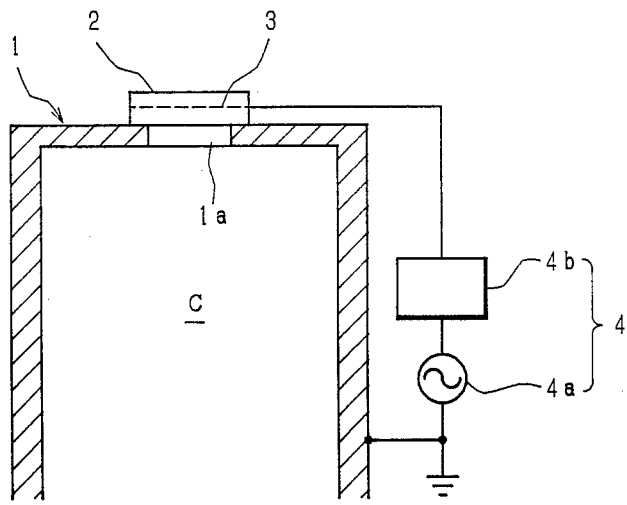
FIGS. 5-7 are vertical sections showing the principal part of other embodiments of the apparatus according to the present invention.
Figure 6:
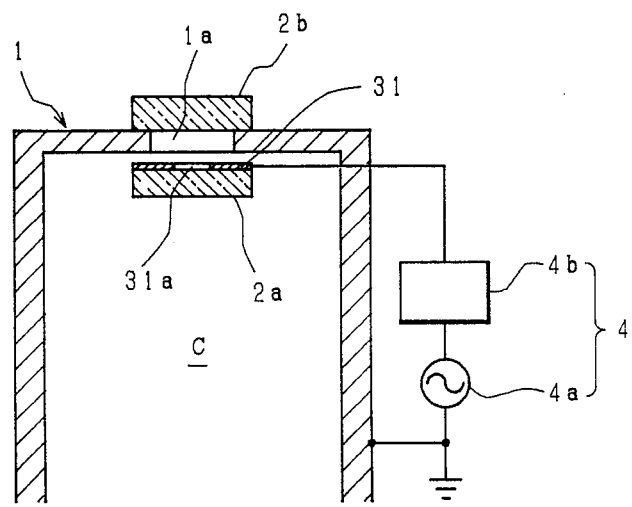

FIGS. 5 and 6 are vertical sections showing the principal part of another embodiments of the apparatus according to the present invention. In the embodiment of FIG. 5, the case is shown where an electrode is buried in the dielectric 2. More concretely, the meshed electrode 3 is buried in the dielectric 2. FIG. 6 shows an embodiment in which an electrode is disposed in the chamber. More concretely, the dielectric 2 comprises a portion $2a$ being provided in the chamber and a portion $2b$ being provided outside the chamber in order to close the window $1a$, and the flat electrode 31 provided with the piercing bore $31a$ is mounted on the top surface of the portion $2a$ inside the chamber.

Figure 7:
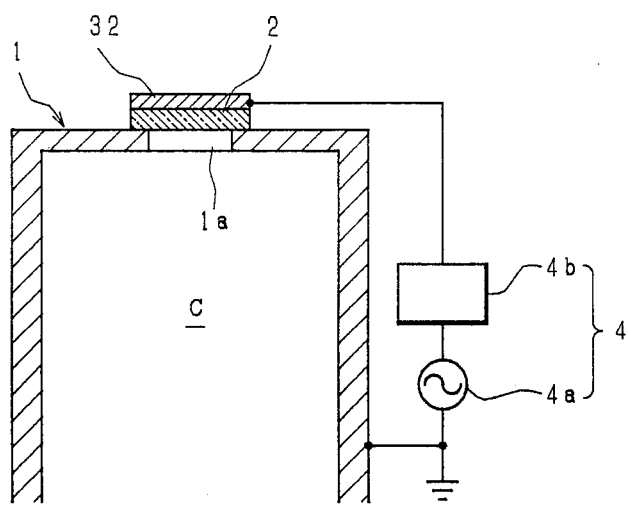

FIG. 7 is a vertical section showing the principal part of another embodiment of the apparatus according to the present invention. In this embodiment, a flat electrode 32 is detachably mounted to the dielectric 2 unlike the aforementioned embodiments wherein electrodes 3 and 31 are fixed to the dielectric 2. In such an embodiment, it is possible to perform repeatedly operations of removing the pile of films generated on the inner surface of the dielectric 2 at a state where the flat electrode 32 is mounted to the dielectric 2, as shown in FIG. 7, then forming a thin film on the specimen (not shown in the drawing) in the chamber C after the flat electrode 32 is demounted and the photo-introducing system or the microwave-introducing system is provided, and finally removing the pile of films generated on the inner surface of the dielectric 2 in the state as shown in FIG. 7 when the transmissivity of the microwaves has lowered as a result of the generation of the pile of films on the inner surface of the dielectric 2. In this case, it is needless to say that it is not necessary to form such a piercing bore in the flat electrode 32, as in the electrode shown in FIGS. 4 and 6.

Moreover, an introduction of sputter gases such as Ar or the like or etching gases such as $Cl_2$, $CF_4$, $SF_6$, $NF_3$, $ClF_3$ or the like will further improve the film-removing efficiencies in removing the film generated on the inner surface of the dielectric 2 in the apparatus of the present invention.

Explanations will be given below on the result of the experiments carried out, using the apparatuses of the present invention.

EXPERIMENT 1

A tungsten CVD has been carried out, using an ECR plasma CVD apparatus to which the apparatus according to the present invention is adapted, provided with an electrode connected to the high-frequency generating source, and a conventional ECR plasma CVD apparatus. The forming conditions in both apparatuses at that time have been as follows.

| | |
|---|---|
| Microwaves (2.45 GHz) | 400 W |
| Flow Rate of $WF_6$ | 10 sccm |
| Flow Rate of $H_2$ | 50 sccm |
| Flow Rate of Ar | 40 sccm |

Figure 8:
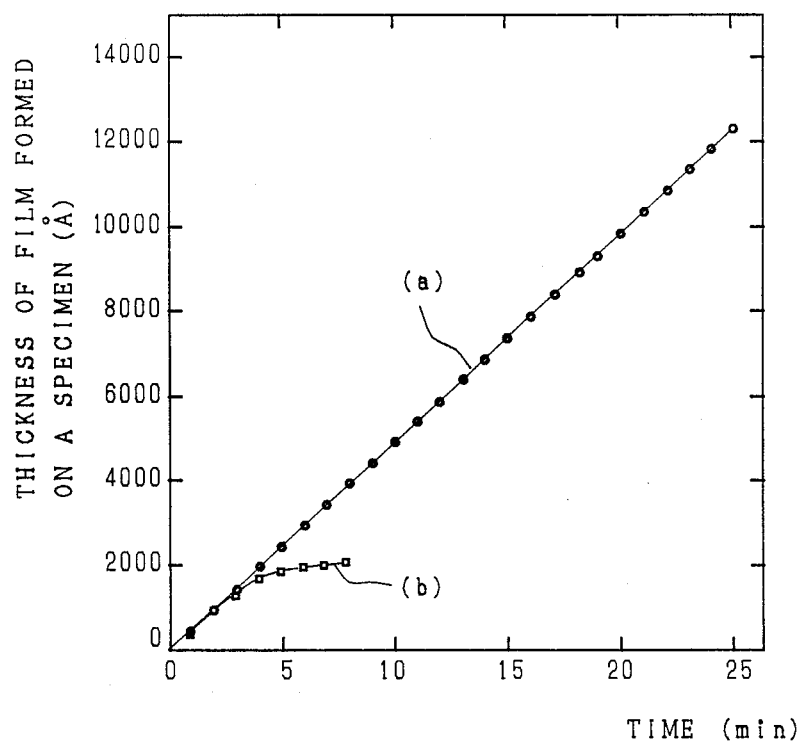
FIG. 8 is a graph showing the results of experiments to form a thin film on a specimen, using the apparatus according to the present invention and conventional apparatuses.

In the apparatus according to the present invention, the conditions of the high frequency to apply to the electrode are determined to be 13.56 MHz (frequency) and 400 W (power). The results of the experiment is shown in FIG. 8. In FIG. 8, the signal (a) shows the results in the apparatus according to the present invention, while the signal (b) shows the results in the conventional apparatus. In the drawing, the vertical axis shows the film thickness of the thin film formed on the specimen (Å) while the horizontal axis shows the time (min) required in film formation. As shown in FIG. 8, in the conventional apparatus the film thickness on the specimen comes to be saturated with the lapse of time and when eight minutes have passed the generation of the plasma has completely stopped. It is supposed that this phenomenon has been caused by the pile of films on the dielectric. In the apparatus of the present invention, however the film thickness on the specimen has shown stable increases with the lapse of time, when the power of 400 W has continued to be applied to the electrode, and the generation of the pile of films on the dielectric is prevented.

EXPERIMENT 2

Figure 9:
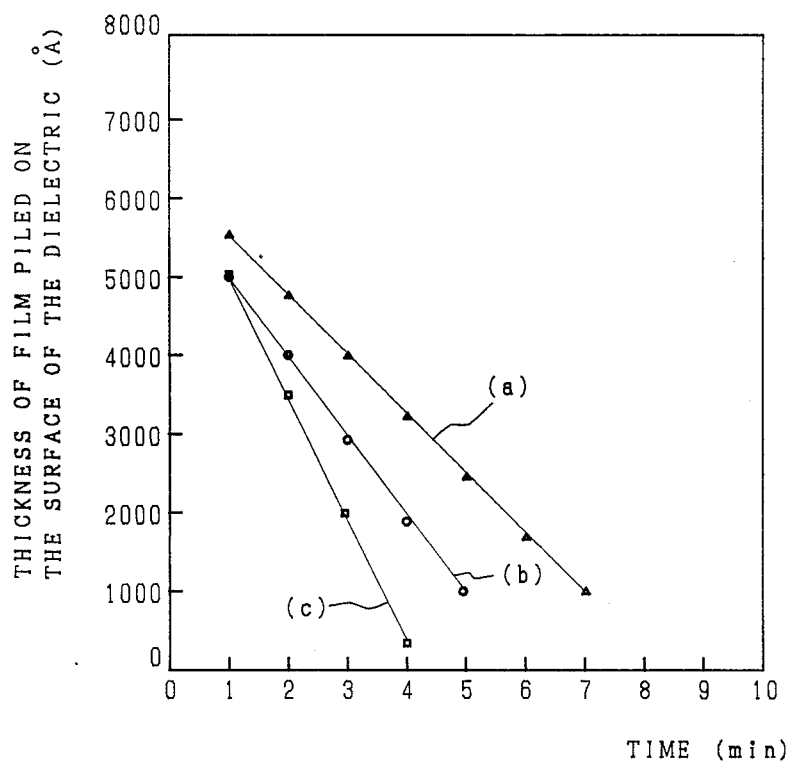
FIG. 9 is a graph showing the results of experiments to remove the films piled on the surface of the dielectric, using the apparatus according to the present invention.

With respect to a dielectric on which a metal film (a tungsten film) was already piled, an experiment for removing that metal film has been carried out, using the apparatus according to the present invention. In this experiment, the power of the high frequency applied to the electrode is changed among 200 W, 300 W and 400 W. In every case, the flow rate of Ar has been determined to be 40 sccm. FIG. 9 is a graph showing the result of this experiment. In FIG. 9, the signals (a), (b) and (c) show each case wherein the power used in 200 W, 300 W and 400 W respectively. The vertical axis shows the film thickness of the metal film (Å) on the dielectric, while the horizontal axis shows the time (min). Every case indicates a decrease in the film thickness with the lapse of time and that the higher the power of the high frequency applied to is, the greater the sputtering effects and the extent of decrease in the film thickness are.

As mentioned above, in the apparatus according to the present invention, the generation of the pile of films on the inner surface of the dielectric can be positively prevented, and in the case where a pile of films is already generated, it is also possible to remove the films.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A thin film forming apparatus including a microwave generating means and in which a thin film can be formed on a specimen which has been put in a chamber of the apparatus, the apparatus having a window through which microwaves generated by the microwave generating means can be introduced into said chamber through a dielectric provided at said window so as to activate a material gas in said chamber and deposit a thin film on the specimen;
   an electrode mounted on said dielectric, said electrode being provided with at least one opening therethrough through which the microwaves pass when activating the material gas in said chamber; and
   a high-frequency generating source connected to said electrode.

2. A thin film forming apparatus as set forth in claim 1, wherein said electrode is fixed to said dielectric.

3. A thin film forming apparatus as set forth in claim 1, wherein said electrode is capable of being mounted to and being demounted from said dielectric.

4. A thin film forming apparatus as set forth in claim 1, further comprising a specimen stand on which said specimen is set.

5. A thin film forming apparatus as set forth in claim 1, further comprising a gas pipe in order to introduce said material gas into chamber.

6. The thin film forming apparatus of claim 1, wherein said at least one opening comprises a single bore through said electrode.

7. A thin film forming apparatus including an electromagnetic wave generating means and in which a thin film can be formed on a specimen which has been put in a chamber of the apparatus, the apparatus having a window through which electromagnetic waves generated by the electromagnetic wave generating means can be introduced into said chamber through a dielectric provided at said window so as to activate a material gas in said chamber and deposit a thin film on the specimen;
   an electrode buried in said dielectric, said electrode having at least one opening therethrough through which the electromagnetic waves pass when activating the material gas in said chamber; and
   a high-frequency generating source connected to said electrode.

8. The thin film forming apparatus of claim 7, further comprising a specimen stand within said chamber on which the specimen is mounted when the thin film is formed, the specimen stand being aligned with the window, the dielectric and the at least one opening in the buried electrode.

9. A thin film forming apparatus as set forth in claim 7, wherein said electromagnetic waves are rays of light.

10. A thin film forming apparatus as set forth in claim 9, wherein said electrode is provided with at least a bore in order to pass the rays of light.

11. A thin film forming apparatus as set forth in claim 9, wherein said electrode has the form of meshes in order to pass the rays of light.

* * * * *